US006423605B1

(12) United States Patent
Sklyarevich et al.

(10) Patent No.: US 6,423,605 B1
(45) Date of Patent: Jul. 23, 2002

(54) METHOD AND APPARATUS FOR FORMING ULTRA-SHALLOW JUNCTION FOR SEMICONDUCTOR DEVICE

(75) Inventors: Vladislav Sklyarevich, Newtown; Michael Shevelev, Feasterville, both of PA (US)

(73) Assignee: Gyrotron Technology, Inc., Bristol, PA (US)

( * ) Notice: Subject to any disclaimer, the term of this patent is extended or adjusted under 35 U.S.C. 154(b) by 0 days.

(21) Appl. No.: 09/708,731

(22) Filed: Nov. 9, 2000

(51) Int. Cl.[7] .................. H01L 21/331; H01L 21/477
(52) U.S. Cl. .................. 438/378; 438/369; 438/795
(58) Field of Search ................... 438/166, 798, 438/378, 369, 542, 795

(56) References Cited

U.S. PATENT DOCUMENTS

| 4,439,245 A | * | 3/1984 | Wu ........................... 148/1.5 |
| 4,981,815 A | * | 1/1991 | Kakoschke ................. 437/173 |
| 5,395,794 A | * | 3/1995 | Sklyarevich et al. ........ 437/173 |
| 5,858,823 A | * | 1/1999 | Yamazaki et al. .......... 438/166 |
| 5,897,381 A | * | 4/1999 | Aronowitz et al. ......... 438/798 |

* cited by examiner

Primary Examiner—John F. Niebling
Assistant Examiner—Walter L. Lindsay, Jr.
(74) Attorney, Agent, or Firm—Dickstein Shapiro Morin & Oshinsky LLP

(57) ABSTRACT

A practical, low-cost method for forming an ultra-shallow junction in a semiconductor material is provided. The method is directed to an initial RTA process using a heat source at a selected temperature and time sufficient to eliminate lattice defects without significant diffusion of the dopants, along with subsequent exposure to electromagnetic radiation having a frequency in the range of the resonance frequency of interstitial impurity ions. The intensity of the electric field is selected to be proportional to the value of the activation barrier potential of the impurity ions. The method may be used for any dopant material.

15 Claims, 1 Drawing Sheet

METHOD AND APPARATUS FOR FORMING ULTRA-SHALLOW JUNCTION FOR SEMICONDUCTOR DEVICE

FIELD OF THE INVENTION

The present invention relates to a method for forming an ultra-shallow junction in semiconductor materials by which there can be obtained an improvement in electrical properties in the areas of sheet resistance, junction and thus, in the performance of the resulting semiconductor device in terms of drive current, of state leakage and the punch-through characteristics due to drain—induced barrier lowering (DIBL) The invention also relates to the semiconductor devices so formed.

BACKGROUND OF THE INVENTION

Crystal materials are formed in semiconductor wafers by the selective introduction of dopant atoms into the lattice structure of the semiconductor material and ion implantation has become a widely used and the most appropriate technique for this. In this technique a semiconductor material is bombarded in a vacuum with accelerated ions of a dopant element. These energetic ions penetrate the semiconductor crystal lattice, and come to rest after losing their energy through nuclear and electronic stopping.

During the ion implantation process the semiconductor crystal lattice is damaged and it is necessary to anneal out this damage before further semi-conductor processing can be effected. Therefore following ion implantation, the semiconductor material is annealed to eliminate crystal defects in the diffused layers and to activate the dopant atoms by putting them on substitutional sites. Annealing involves heating the semiconductor material. Conventionally this is done by maintaining the semiconductor material at an elevated temperature, e.g. 900 degrees to 1100 degrees Centigrade. Such a process is of course time consuming and limits the throughput rate. Further, the high temperatures and extended times involved can lead to undesirable diffusion of the dopant. As a result of such diffusion, annealing increases junction depths. Also, thermally activated processes limit the active doping concentration to the solid solubility limit, and hence cause the sheet resistance values to be too high.

The semiconductor industry is moving toward smaller, higher speed devices. One of the conditions for achieving these is limiting the junction depths to less than one micron and better yet if it will be on the order of a few hundred Angstroms or less. Shallow junctions cause less DIBL as channel lengths are scaled down. This allows achieving higher speed and higher integration density as well as reducing short channel effects.

There are different ways to accomplish shallow junctions. The first and most common way is by using low-energy implants combined with rapid thermal annealing (RTA) or other schemes, which minimizes the time and temperature of thermal processing. Usually this is accomplished by using for a selected short time such heat sources as lasers (U.S. Pat. No. 5,399,506), light (U.S. Pat. No. 4,729,962), infrared (U.S. Pat. No. 6,069,062), Xenon and arc lamps (U.S. Pat. Nos. 4,350,537 and 4,331,485), plasma (U.S. Pat. No. 5,672,541), as well as using low frequency (0.9–2.45 GHz) microwave (U.S. Pat. No. 4,667,076). In this case of RTA, there is transient enhanced diffusion (TED) of dopants such as B due to the coupling of B with point defects such as neutral (and charged) Si interstitials which may be released from extended defects such as dislocation loops and rod-like defects. Rapid and multi-stage heating (U.S. Pat. No. 5,773,337) approaches allow reducing the junction depth but not much because the same heating process is used to accomplish both of the main goals: removing crystal damage to the semiconductor material and activating dopants. Optimally these processes require different conditions.

This contradiction is the main problem because it is impossible to separate heating (heat parameters such as temperature and time) of dopant for activation, and lattice for recrystallization (in the case of solid phase epitaxy of amorphous layers), in cases when such heat sources as infrared, laser, light, and other non-selective heaters are used. U.S. Pat. No. 5,395,794 describes activation of the impurity ions by electromagnetic energy radiation with a frequency substantially equal to the resonance frequency of the interstitial impurity ions in the semiconductor material (selective activation). Microwave excitation of an appropriate frequency may break up or prevent the formation of such B-interstitial complexes, thereby minimizing TED, and reducing junction depths. Furthermore, non-thermal microwave excitation may allow the substitutional B concentration to exceed the thermodynamic solid solubility limit, thus reducing sheet resistance. The ions are excited and are raised to an energy level in accordance with the intensity of the electric field of the incident electromagnetic wave. There is a problem with this method in conducting the other important process: removing crystal damage to the semiconductor material that requires heating the lattice to a particular temperature for a certain time (i.e. thermal budget). Because the intensity of the electric field of the incident electromagnetic wave is fixed for the dopant activation process there is no room for selecting the lattice heating level (temperature) that also depends on the level of the electric field (on microwave power). Power must be increased because semiconductor materials are low absorbers of microwave energy. However, increasing the power to achieve the required lattice temperature can cause increasing ion diffusion and as a result, increase the junction depths.

None of the art known to the applicant has provided a satisfactory process for fabricating ultra-shallow junctions of selected junction depth and sheet resistance, particularly where the required junction depth cannot be obtained simply by reducing the implant energy and thermal budget. Accordingly, a need exists for improved methods for fabricating ultra-shallow junctions in semiconductor materials and for improved methods for activating implanted dopants in semiconductor materials by thermal processing.

BRIEF SUMMARY OF THE INVENTION

Therefore, it is an object of the present invention to overcome the above problems encountered in the art and to provide a method for forming ultra-shallow junctions of semiconductor materials, whereby their electrical properties (sheet and contact resistance), and their barrier structures can be improved and thus the properties and reliability of the resulting semiconductor device can also be improved in the areas of drive current, off-state leakage punch-through behavior and hot carrier reliability.

In accordance with the present invention, there is provided a method for forming an ultra-shallow junction in a semiconductor material having a lattice and implanted impurity ions having a resonance frequency, comprising an initial rapid heating process using a heat source at a selected temperature and time sufficient to eliminate lattice defects without significant diffusion of the dopants and then exposing the semiconductor materials to electromagnetic radiation. The radiation has a frequency approximately within a range of the resonance frequency of the interstitial impurity ions in the semiconductor material and an electric field intensity range that does not appreciably exceed an activation barrier potential of these interstitial impurity ions.

In a further embodiment of the invention, there is provided a method of forming an ultra shallow junction dopant region in semiconductor substrate having a lattice structure. The method comprises forming the dopant region in the substrate to a depth of less than about one micron, wherein the dopant region includes interstitial impurities in the substrate lattice. The substrate is then heated to reduce lattice defects without producing substantial diffusion of the implanted impurities within the substrate. The implanted impurities are selectively excited without substantially heating the surrounding material of the substrate, so as to cause the impurities to move to substitutional positions within the lattice structure, or alternatively, the substrate is exposed to electromagnetic radiation having a frequency approximately within the range of the resonance frequency of the interstitial impurities. The electromagnetic radiation has an electric field intensity which does not appreciably exceed an activation barrier potential of the interstitial impurities.

The method of the invention according to the embodiments hereinafter described effectively allows achieving an ultra shallow junction as well as improves the quality of the formed junction, and reduces the time and cost of the semiconductor fabrication process.

The invention is also directed to the resultant semiconductor device which contains a shallow depth (e.g. less than about one micron) dopant region having implanted impurities in a crystal lattice that has substantially no defects in the lattice structure. The implanted impurities, which are typically in the form of ions, have moved from their interstitial positions to their substitutional positions.

An apparatus for forming a shallow junction dopant region within a substrate is also provided as part of the invention. The apparatus includes a first heating source for heating a substrate having an impurity implant therein to reduce lattice defects in the substrate without substantial diffusion of the impurity implant into the substrate. The apparatus also has an electromagnetic radiation source for applying an electromagnetic field to the substrate which is within the range of the resonance frequency of the impurity and which has an electric field intensity which does not appreciably exceed an activation potential of the impurity implant.

Further objects, features and advantages of the invention will become apparent from a consideration of the following description and the appended claims when taken in connection with the accompanying drawings and tables.

DETAILED DESCRIPTION OF THE INVENTION

Figure 1:
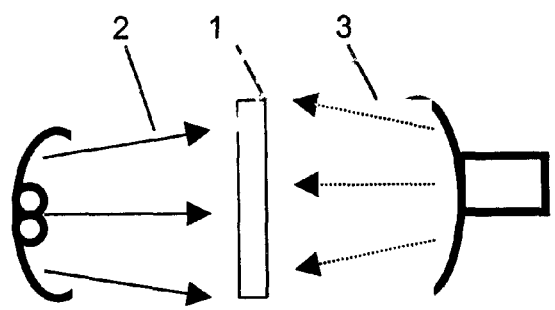
FIG. 1 illustrates a method for forming an ultra-shallow junction of a semiconductor material in accordance with one embodiment of the invention.

Impurity ions introduced into the semiconductor by ion implantation are electrically inactive because they occupy interstitial sites. In the method according to an embodiment illustrated in FIG. 1, the semiconductor material 1 is first subjected to an intense source heater such as infrared, laser or plasma 2 to heat it. The temperature to which semiconductor material is heated and heating time are selected to be sufficient to eliminate lattice defects with minimal diffusion of the dopants. These parameters primarily depend on the kind of semiconductor material and the kind, energy and concentration of the dopants, and can be obtained by experimentation. For the most common kind of crystals (e.g., Si, GaAs) and dopants (e.g., B, P, and As in the case of Si, and Be, Zn, Si; and S in the case of GaAs) such temperature ranges are between about 700C to about 800C. For amorphized samples SPE regrowth is possible within a range of about 550 to about 600C. After this the semiconductor material is irradiated by electromagnetic radiation 3 having a wavelength on the order of millimeters. The preferable frequency range is between about 30 GHz to about 150 GHz. The irradiation may be carried out at any time after the material is recrystallized and crystal defects that result from implantation are eliminated. The electromagnetic radiation passes through the semiconductor material and interacts only minimally with the crystalline lattice of the semiconductor material. The lattice includes charge carrier electrons and holes in addition to impurity ions located both in substitution and interstitial sites.

Due to a low concentration of charge carriers, the electromagnetic energy that the charge carriers absorb is relatively insignificant. The minimal interaction of the crystalline lattice ions with the electromagnetic radiation is of a non-resonance character because the natural frequencies of the ions are of a shorter bandwidth, typically within the infrared band of the frequency spectrum corresponding to the Raman active or optic branch of the phonon spectrum. Therefore, the radiation absorption coefficient of the semiconductor material is low. This causes uniform dissipation of the energy throughout a substantial cross-section of the material, resulting in a relatively insignificant additional uniform heating of the semiconductor material which does not causes substantial diffusion of impurity ions. However, because the natural frequency of impurity ions located between the lattice nodal points falls within the 30–150 GHz range, they are excited by the electromagnetic radiation. Interaction of the impurity ions with electromagnetic radiation having a wavelength on the order of millimeters is generally of a resonance character. The maximum interaction occurs at a particular frequency and is characterized by high efficiency energy transfer.

Such particular activation of the impurity ions is called selective activation or selective excitation. The ions are excited by the electromagnetic energy and are raised to an energy level in accordance with the intensity of the electric field of the incident electromagnetic wave.

Thus, it is preferred to use electromagnetic radiation having a wavelength on the order of millimeters. Radiation of this wavelength does not appreciably interact with the semiconductor material being treated. Instead, it is selectively and efficiently absorbed primarily by the implanted impurity ions essentially without substantial heating of the surrounding semiconductor material. The energy selectively imparted to the interstitial ions in this invention increases the probability that the interstitial impurity ions will leave their equilibrium position and will move to a neighboring substitutional position. Such an approach allows controlling the activation process separate from other processes because no direct heating of ions is needed for this. Moreover, it is possible to cool (by cold gas) the semiconductor material after heating prior to or during microwave processing to reduce diffusion.

To effectuate the process it is preferred to impart the ions with energy sufficient for the ions to overcome the activation barrier potential. This occurs through proper determination of the electric field intensity of the incident electromagnetic radiation. The value of the barrier potential depends on the particular variety of materials implanted onto the semiconductor material and on the particular variety of impurities. However, in all cases, the intensity of electric field is selected in accordance with the value of the electrical activation barrier potential. In this case, the impurity ions become electrically active, thereby possessing either donor or acceptor properties.

Productivity of the process for treating semiconductor materials by this selective activation method may be increased by employing an electromagnetic radiation generator such as a gyrotron, klystron, magnetron, traveling wave tube, backward wave oscillators, and especially a gyrotron, which direct the concentration of electromagnetic radiation onto the specific surface area being treated in order to achieve high power levels. This procedure provides a controlled electric field intensity over a large treated area and reduces the processing time.

Figure 2:
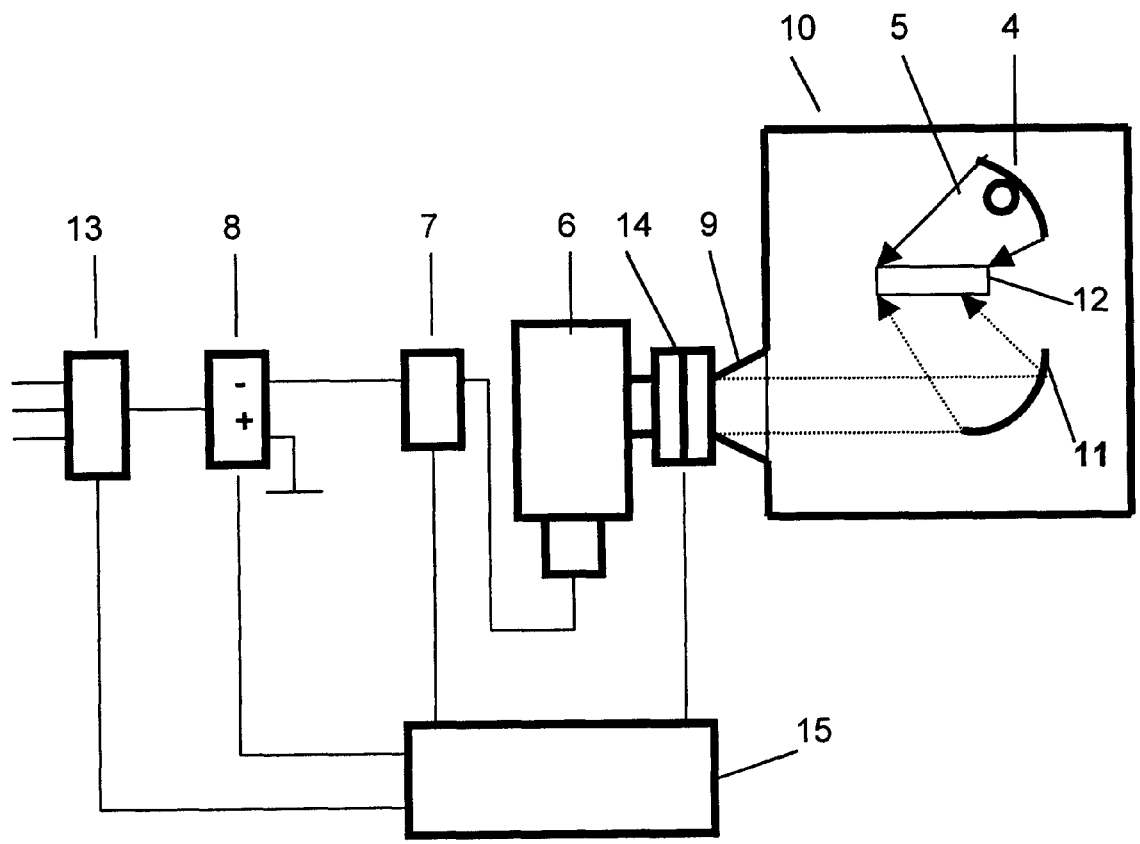
FIG. 2 shows a block diagram illustrating the basic infrared-gyrotron beam installation used in the method of the invention.

In FIG. 2 a non-limiting example of an infrared-microwave installation that can be used in the inventive method is illustrated. As noted above, microwave radiation with the preferred frequency and power density can be attained using generators such as the gyrotron, klystron, and the like. The annealing temperature can be achieved using infrared bulbs. The infrared part of the installation includes two halogen lamps 4 (2 KW each) installed in a specialized reflector unit 5 that ensures the uniform distribution of infrared power over the sample area up to 0.2 m$^2$ and a ramp rate of around 100 c/s. Shutting down the infrared bulbs at the moment when the required temperature is achieved can be done automatically by a special electronics unit available in the art. Irradiation can be stopped also by an available electronic timer at the selected time. Timer accuracy is around 0.1 sec.

The microwave part of the installation includes a gyrotron 6 that operates at a particular frequency with a maximum output CW power of about 20 kilowatts. The gyrotron is connected to a filament transformer 7 at 500 W (208V/25V) and a power supply 8 at 240V/35 KV (with I -up to 3A, and power—up to 90 KW). The microwave beam passes through a waveguide 9 into a chamber 10 where it is directed with a mirror 11 to a sample area 12 which is made from a transparent material suitable for microwave, for example from quartz. The mirror ensures uniform (up to 96%) distribution of microwave power over the sample area up to 0.2 m$^2$.

Microwave power is adjusted by a thyristor power regulator/switcher 13 and measured by a colorimeter 14 which is installed in a gyrotron output window. Infrared and microwave power and all other parameters of the infrared bulbs and gyrotron are monitored by a control panel 15. Shutting down the gyrotron at the requisite moment is achieved automatically and the heating time is controlled by an electronic stopwatch with an accuracy to about 0.2 sec. The installation includes elements necessary to measure the temperature: a pyrometer Mikron M90—IN, oscilloscope HP 54603B, computer and other equipment.

It is understood that the particular installation illustrated in FIG. 2 is optimally designed for research and development or demonstration testing of the inventive method. A person of ordinary skill in the art can easily modify the installation for manufacturing processes of various scales.

Below are examples of the above described method for treating semiconductor materials according to various embodiments of the invention.

EXAMPLES

The following examples are presented to provide a more detailed explanation of the present invention and of the preferred embodiments thereof and are intended as illustrations and not as limitations.

A semiconductor material sample was placed into the chamber in the sample area. The infrared bulbs and gyrotron were set up as described in FIG. 2. Because the frequency of the gyrotron cannot be adjusted, different generators operating at different frequencies (30 GHz, 82.9 GHz, 150 GHz, and 180 GHz) were used. The temperature of the sample was controlled by pyrometer. Corresponding electrical signals from pyrometer were sent to oscilloscope, computer, and control panel to control the temperature. Microwave power was controlled by colorimeter 14 (see FIG. 2) and electric field intensity E was estimated as $$E = 19.4 \{I\ (W/cm^2)\}^{1/2} V/cm,$$

where I is the microwave power intensity which was calculated as the ratio of microwave power to the size of spot area (See for example: Max Born and Emil Wolf, Principles of Optics, The Macmillian Company, NY, 1964, p. 24).

There were several groups of samples that were prepared by the Microelectronics Research Center (MRC) of the University of Texas at Austin, Sematech, and the New Jersey Institute of Technology (NJIT). In the samples B and BF$_2$ were implanted into Si and they were distinguished by the implant energy (between 300 eV and 5 keV) and doses (1E15 cm$^{-2}$ to 5E15 cm$^{-2}$). The sheet resistances/spreading resistance profile measurements and secondary ion mass spectroscopy (SIMS) were performed by the MRC, Sematech and NJIT on the processed samples to determine electrical junction depth and active carrier concentration profiles, and metallurgical junction depth respectively. A four-point probe was used for sheet resistance measurements.

Different variations of processing (heating) for each sample group were tested: by infrared alone, consecutively by infrared and microwave with different time intervals, microwave power (electric field intensity) and frequency, simultaneously by infrared and microwave (with different time intervals between the start of each), by microwave alone for different time intervals and power.

The treatment results are given below in Tables No.s 1–3.

As can be seen in the Tables the best results (the shallowest junction depth (active carrier concentration profiles) measured on the level of 1E18 cm$^{-2}$) were achieved under conditions where samples were first heated to within the range of about 800C (using infrared) for approximately 12 seconds and then (immediately or after a short or long time) irradiated by microwave with a frequency between about 30 and 150 GHz with electric field intensities around 5×10$^4$ V/m. (Nos. 1.1–1.6; 2.1–2.6; 3.1–3.6). At the stated conditions, lattice defects were eliminated and efficient activation occurred without significant diffusion of the dopants. In all these cases ultra-shallow junctions, which in most cases did not exceed about 200 Angstroms, were formed. Cooling material after infrared heating and during microwave processing made the junction narrower (No.s 1.7, 2.7, 3.7). This occurred because cooled gas (nitrogen) did not have any influence on the activation process (on resonance electrodynamics process of interaction of microwave with dopants), but it cooled the processed material, thereby reducing diffusion. The described results clearly demonstrate the basic concept of the invention. It was demonstrated by all other results as well. Switching microwave simultaneously with infrared (No.s 1.8, 2.8, 3.8) or starting either a short interval after the other (No.s 1.9, 2.9, 3.9) did not create ultra-shallow junctions because at the moment the microwave started to work the lattice defects had not been eliminated. Also it can be seen that an efficient activation process did not occur when microwave radiation with an electric field intensity lower than about 5 V/m was used (No.s 1.10, 2.10, 3.10). In cases when the intensity was too high (No.s 1.11, 2.11, 3.11), the depth of the junction increased because the extra microwave energy stimulated the diffusion process. The same result was achieved when microwave with a frequency higher than 150 GHz (No.s 1.13, 1.14, 2.13.2.14, 3.13, 3.14) or lower than 30 GHz (No.s 1.12, 2.12, 3.12) was used. In these cases microwave energy simply heated the material (as any other heat source, for example infrared) without selective activation of the implanted ions. Junction depth increased also when the temperature of infrared heating was high (No.s 1.15, 1.16, 2.15, 2.16, 3.15, 3.16) (heating time was too long).

For each group of samples there were control sample treatments by only infrared or microwave. Processing samples by using only infrared or microwave either does not lead to activating (if the level of energies selected was approximately the same as was used in the previously described successful experiments ) (No.s 1.17, 2.17, 3.17, 1.18, 2.18, 3.18), or resulted in achieving wide junctions (when the level of energies selected was high enough to heat processed material to temperatures higher than 900C) (No.s 1.19, 2.19, 3.19, 1.20, 2.20, 3.20).

Thus, the invention contemplates the formation of shallow junction with depths of less than about 1 micron, and preferably about 200 Angstroms or less.

TABLE 1

(Implant matrix: B, energy - 300 eV, dose - 5E15 ions/cm$^{-2}$)

| | | Sequence and parameters of treatment | | | | | |
|---|---|---|---|---|---|---|---|
| | Infrared | Pause Temp-re | Microwave | | | Sheet | |
| Sample | Temp-re | T, C/ | Temp-re | Frequency | Intensity | resistance | Depth |
| # | T, C | (time) | T, C | (GHz) | ($10^4$ V/m) | (Ohm/cm) | (A) |
| 1.1 | 800 | — | 680 | 82.9 | 5 | 530 | 180 |
| 1.2 | 800 | — | 640 | 82.9 | 5 | 470 | 200 |
| 1.3 | 800 | — | 560 | 30 | 5 | 740 | 220 |
| 1.4 | 800 | — | 770 | 150 | 5 | 590 | 250 |
| 1.5 | 800 | 60 (1 min) | 540 | 82.9 | 5 | 570 | 280 |
| 1.6 | 800 | 30 (1 h) | 500 | 82.9 | 5 | 470 | 200 |
| 1.7 | 800 | −3 | 515 | 82.9 | 5 | 680 | 160 |
| 1.8 | 800 | — | 780 | 82.9 | 5 | 7800 | NA* |
| 1.9 | 800 | — | 760 | 82.9 | 5 | 5700 | NA |
| 1.10 | 800 | — | 655 | 82.9 | 1 | 4700 | NA |
| 1.11 | 800 | — | 800 | 82.9 | 10 | 420 | 880 |
| 1.12 | 800 | — | 470 | 20 | 5 | 8700 | NA |
| 1.13 | 800 | — | 980 | 180 | 5 | 370 | 1180 |
| 1.14 | 800 | — | 680 | 180 | 1 | 3100 | NA |
| 1.15 | 950 | — | 740 | 82.9 | 5 | 340 | 1000 |
| 1.16 | 950 | 90 (1 min) | 600 | 82.9 | 5 | 390 | 870 |
| 1.17 | 800 | — | — | — | — | 6700 | NA |
| 1.18 | — | — | 550 | 82.9 | 5 | 7800 | NA |
| 1.19 | 1050 | — | — | — | — | 990 | 1200 |
| 1.20 | — | — | 970** | 82.9 | 5 | 780 | 900 |

*No activation occurred
**Irradiation time - 25 sec.

TABLE 2

(Implant matrix: B, energy - 500 eV, dose - 1E15 ions/cm$^{-2}$)

| | | Sequence and parameters of treatment | | | | | |
|---|---|---|---|---|---|---|---|
| | Infrared | Pause Temp-re | Microwave | | | Sheet | |
| Sample | Temp-re | T, C/ | Temp-re | Frequency | Intensity | resistance | Depth |
| 1.1 | 800 | — | 670 | 82.9 | 5 | 470 | 200 |
| 1.2 | 800 | — | 650 | 82.9 | 5 | 490 | 210 |
| 1.3 | 800 | — | 580 | 30 | 5 | 690 | 190 |
| 1.4 | 800 | — | 760 | 150 | 5 | 680 | 220 |
| 1.5 | 800 | 60 | 570 | 82.9 | 5 | 490 | 190 |

TABLE 2-continued (Implant matrix: B, energy - 500 eV, dose - 1E15 ions/cm$^{-2}$)

Sequence and parameters of treatment

| Sample | Infrared Temp-re | Pause Temp-re T, C/ | Microwave Temp-re | Microwave Frequency | Microwave Intensity | Sheet resistance | Depth |
|---|---|---|---|---|---|---|---|
| 1.6 | 800 | 30 (1 min) | 480 | 82.9 | 5 | 380 | 210 |
| 1.7 | 800 | −3 (1 h) | 500 | 82.9 | 5 | 600 | 180 |
| 1.8 | 800 | — | 780 | 82.9 | 5 | 9100 | NA* |
| 1.9 | 800 | — | 770 | 82.9 | 5 | 4700 | NA |
| 1.10 | 800 | — | 670 | 82.9 | 1 | 8800 | NA |
| 1.11 | 800 | — | 780 | 82.9 | 10 | 350 | 1100 |
| 1.12 | 800 | — | 470 | 20 | 5 | 8000 | NA |
| 1.13 | 800 | — | 940 | 180 | 5 | 540 | 950 |
| 1.14 | 800 | — | 700 | 180 | 1 | 5700 | NA |
| 1.15 | 950 | — | 790 | 82.9 | 5 | 420 | 1100 |
| 1.16 | 950 | 90 (1 min) | 630 | 82.9 | 5 | 430 | 950 |
| 1.17 | 800 | — | — | — | — | 8000 | NA |
| 1.18 | — | — | 550 | 82.9 | 5 | 5500 | NA |
| 1.19 | 1050 | — | — | — | — | 770 | 1000 |
| 1.20 | — | — | 960** | 82.9 | 5 | 680 | 1000 |

*No activation occurred
**Irradiation time - 25 sec.

TABLE 3

(Implant matrix: B (BF$_2$), energy - 5000 eV, dose - 1E15 BF$_2$ ions/cm$^{-2}$)

Sequence and parameters of treatment

| Sample | Infrared Temp-re | Pause Temp-re T, C/ | Microwave Temp-re | Microwave Frequency | Microwave Intensity | Sheet resistance | Depth |
|---|---|---|---|---|---|---|---|
| 1.1 | 800 | — | 700 | 82.9 | 5 | 870 | 220 |
| 1.2 | 800 | — | 690 | 82.9 | 5 | 670 | 250 |
| 1.3 | 800 | — | 580 | 30 | 5 | 560 | 200 |
| 1.4 | 800 | — | 780 | 150 | 5 | 880 | 270 |
| 1.5 | 800 | 60 (1 min) | 650 | 82.9 | 5 | 660 | 190 |
| 1.6 | 800 | 30 (1 h) | 650 | 82.9 | 5 | 570 | 200 |
| 1.7 | 800 | −3 | 640 | 82.9 | 5 | 780 | 190 |
| 1.8 | 800 | — | 770 | 82.9 | 5 | 9000 | NA* |
| 1.9 | 800 | — | 750 | 82.9 | 5 | 7000 | NA |
| 1.10 | 800 | — | 640 | 82.9 | 1 | 5600 | NA |
| 1.11 | 800 | — | 800 | 82.9 | 10 | 540 | 1000 |
| 1.12 | 800 | — | 490 | 20 | 5 | 7800 | NA |
| 1.13 | 800 | — | 1000 | 180 | 5 | 4250 | 990 |
| 1.14 | 800 | — | 660 | 180 | 1 | 2700 | NA |
| 1.15 | 950 | — | 750 | 82.9 | 5 | 440 | 1000 |
| 1.16 | 950 | 90 (1 min) | 630 | 82.9 | 5 | 590 | 1000 |
| 1.17 | 800 | — | — | — | — | 8700 | NA |
| 1.18 | — | — | 600 | 82.9 | 5 | 9800 | NA |
| 1.19 | 1050 | — | — | — | — | 780 | 1100 |
| 1.20 | — | — | 1000** | 82.9 | 5 | 380 | 1300 |

*No activation occurred
**Irradiation time - 25 sec.

It is apparent to those skilled in the art that the above examples do not limit the scope of the application of the method according to the invention. Instead, the present invention has been described in an illustrative manner. It is to be understood that the terminology used herein is intended to be in the nature of words of description rather than of limitation. Many modifications and variations of the present invention are possible in light of the above teachings. Therefore, within the scope of the appended claims, the present invention may be practiced other than as specifically described.

What is claimed as new and desired to be protected by Letters Patent of the United States is:

1. A method for forming an ultra-shallow junction of a semiconductor material having a lattice and implanted impurity ions having a resonance frequency, comprising:
   carrying out an initial heating process using a heat source at a selected temperature and time sufficient to eliminate lattice defects without diffusion of the implanted impurity ions; and
   exposing the semiconductor material to electromagnetic radiation that has a frequency approximately within a range of the resonance frequency of the implanted impurity ions in the semiconductor material and an electric field intensity range that is effective to not appreciably exceed an activation barrier potential of the implanted impurity ions during a time sufficient for efficient activation.

2. A method in accordance with claim 1, wherein exposing the semiconductor material to electromagnetic radiation starts at any time after said initial heating process is complete.

3. A method in accordance with claim 1, wherein the electromagnetic radiation has a frequency that is between about 30 GHz and about 150 GHz.

4. A method in accordance with claim 1, wherein the heat source is selected from the group consisting of an infrared source, a laser source, a light source, a plasma source, and a hot gas source.

5. A method in accordance with claim 1, wherein the source of electromagnetic radiation is selected from the group consisting of gyrotron, klystron, magnetron, traveling wave tube, and backward wave oscillator.

6. A method in accordance with claim 3, wherein the semiconductor material is cooled prior to or during electromagnetic irradiation.

7. A method of forming a shallow junction dopant region in a semiconductor substrate having a lattice structure, said method comprising:
   forming said dopant region in said substrate to a depth less than about one micron, said dopant region including interstitial impurities in said substrate lattice;
   heating said substrate to reduce lattice defects without producing substantial diffusion of said impurities within said substrate; and
   selectively exciting said impurities to cause said impurities to move to substitutional positions within said lattice structure without substantially heating the surrounding material of said substrate.

8. A method as in claim 7, wherein said act of selectively exciting occurs after said act of heating is completed.

9. A method as in claim 8, further comprising cooling said substrate after said acts of exciting said implanted impurities and said heating are completed.

10. A method as in claim 8, further comprising cooling said substrate during said act of selectively exciting said implanted impurities.

11. A method as in claim 7, wherein said act of selectively applying imparts said impurities with an energy sufficient for the impurities to overcome the activation barrier potential.

12. A method of forming a shallow junction dopant region in a semiconductor substrate having a lattice structure, said method comprising:
   forming said dopant region in said substrate to a depth less than about one micron, said dopant region including interstitial impurities in said substrate lattice;
   heating said substrate to reduce lattice defects without producing substantial diffusion of said impurities within said substrate; and
   exposing said substrate to electromagnetic radiation having a frequency approximately within the range of the resonance frequency of said interstitial impurities, said electromagnetic radiation having an electric field intensity which does not appreciably exceed an activation barrier potential of said interstitial impurities.

13. A method for forming an ultra-shallow junction of a semiconductor material having a lattice and implanted impurity ions having a resonance frequency, comprising:
   carrying out an initial heating process to eliminate lattice defects without diffusion of the implanted impurity ions; and
   exposing the semiconductor material to electromagnetic radiation that has frequency and electric field intensity ranges that are effective to not appreciably exceed an activation barrier potential of the implanted impurity ions, said exposing being sufficient for efficient activation of said impurity ions;
   wherein the semiconductor material is cooled prior to or during said exposing to electromagnetic irradiation.

14. A method of forming a shallow junction dopant region in a semiconductor substrate having a lattice structure, said method comprising:
   forming said dopant region in said substrate to a depth less than about one micron, said dopant region including interstitial impurities in said substrate lattice;
   heating said substrate to reduce lattice defects without producing substantial diffusion of said impurities within said substrate;
   subsequent to said heating, selectively exciting said impurities to cause said impurities to move to substitutional positions within said lattice structure without substantially heating the surrounding material of said substrate; and
   subsequent to said exciting, cooling said substrate.

15. A method of forming a shallow junction dopant region in a semiconductor substrate having a lattice structure, said method comprising:
   forming said dopant region in said substrate to a depth less than about one micron, said dopant region including interstitial impurities in said substrate lattice;
   heating said substrate to reduce lattice defects without producing substantial diffusion of said impurities within said substrate;
   subsequent to said heating, selectively exciting said impurities to cause said impurities to move to substitutional positions within said lattice structure without substantially heating the surrounding material of said substrate; and
   cooling said substrate during said act of selectively exciting said implanted impurities.

* * * * *